United States Patent [19]

Shyu

[11] Patent Number: 5,949,255

[45] Date of Patent: Sep. 7, 1999

[54] METHOD AND APPARATUS FOR GENERATING ACTIVE PULSE OF DESIRED POLARITY

[75] Inventor: Rong-Fuh Shyu, Hsinchu, Taiwan

[73] Assignee: Winbond Electronics Corp., Taiwan

[21] Appl. No.: 08/935,854

[22] Filed: Sep. 23, 1997

[30] Foreign Application Priority Data

Aug. 1, 1997 [TW] Taiwan .................................. 86110978

[51] Int. Cl.$^6$ ........................................................ H03K 5/01
[52] U.S. Cl. ................................ 327/36; 327/31; 327/165
[58] Field of Search .................................. 327/31, 35, 36, 327/90, 99, 113, 114, 160, 165, 166, 172

[56] References Cited

U.S. PATENT DOCUMENTS

5,621,758  4/1997  Suzuki et al. ............................ 375/238
5,706,036  1/1998  Lam et al. ............................... 345/213

Primary Examiner—Timothy P. Callahan
Assistant Examiner—Jeffrey Zweizig
Attorney, Agent, or Firm—Proskauer Rose LLP

[57] ABSTRACT

A method for generating an output signal of desired polarity from an input periodical signal of frequency f1 via a clock signal of frequency f2, wherein f2 is substantially greater than f1, is provided. The input periodical signal includes a cyclic duration T1 of a first logic state and duration T2 of a second logic state. The method includes the steps of (1) counting pulses N of the clock signal during T1; (2) counting pulses M of the clock signal during T2; (3) generating the output signal by inverting the input periodical signal as M being larger than N and an activated state of select signal are determined.

11 Claims, 6 Drawing Sheets

METHOD AND APPARATUS FOR GENERATING ACTIVE PULSE OF DESIRED POLARITY

FIELD OF INVENTION

The invention relates to generation of active pulse of desired polarity from an ambiguous input periodical signal.

BACKGROUND OF INVENTION

When designing an electronic circuit, it is sometimes an issue to recognize an active pulse in a periodical signal coming from other electronic module within the system. It is particular true when periodical signal concerned does not have an industrial standard definition with respect to the polarity of the active pulse in the periodical signal. For instance, with respect to VGA (video graphic adapter) subsystem of a personal computer, different makers defines active high Hsync, Vsync signals or active low Hsync, Vsync signals under different display modes respectively.

Figure 1:
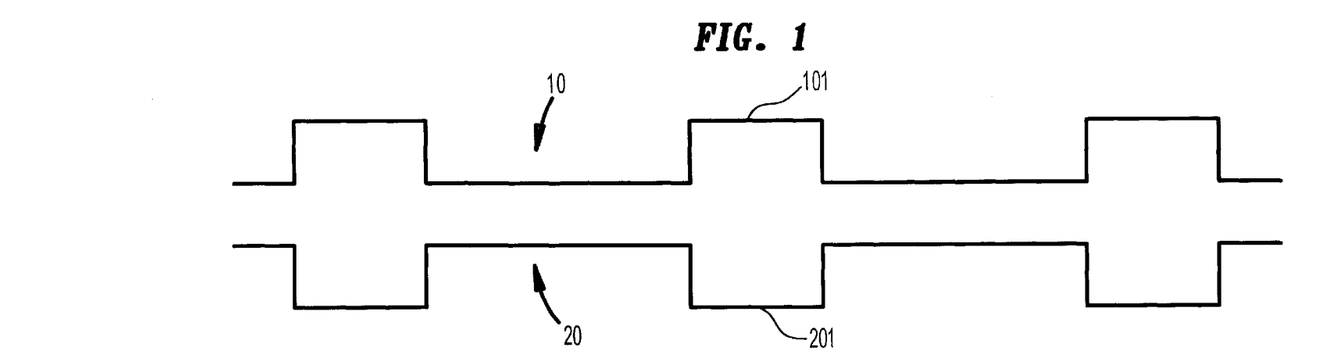
FIG. 1 shows one periodical signal with different polarities under different operation modes.

As illustrated in FIG. 1, a periodical signal 10 has an active high pulse 101 under one operation mode while the same periodical signal 20 has an active low pulse 201 under another operation mode. When a subsystem receives this kind of interface signal from another subsystem, the designer has to devise some way to overcome the compatibility issue.

The main object of the present invention is to provide a solution to generate active pulse of desired polarity from an ambiguous input periodical signal.

SUMMARY OF INVENTION

An apparatus is provided to include a counter, an edge detection circuit, a logic circuit and an inverting circuit.

The counter counts the pulses of a substantially high frequency clock during low duration of the input periodical signal and during high duration of the input periodical signal. The detection circuit detects transition of the input periodical signal and, in response, generates a reset signal to the counter. The logic circuit receives the counts from the counter respectively and generates an inversion control signal. The inverting circuit, responsive to the inversion control signal from the logic circuit, generates the output signal with active pulse of desired polarity.

DETAILED DESCRIPTION OF THE INVENTION

A first embodiment of the instant invention will be described below with reference to FIG. 2.

Figure 2:
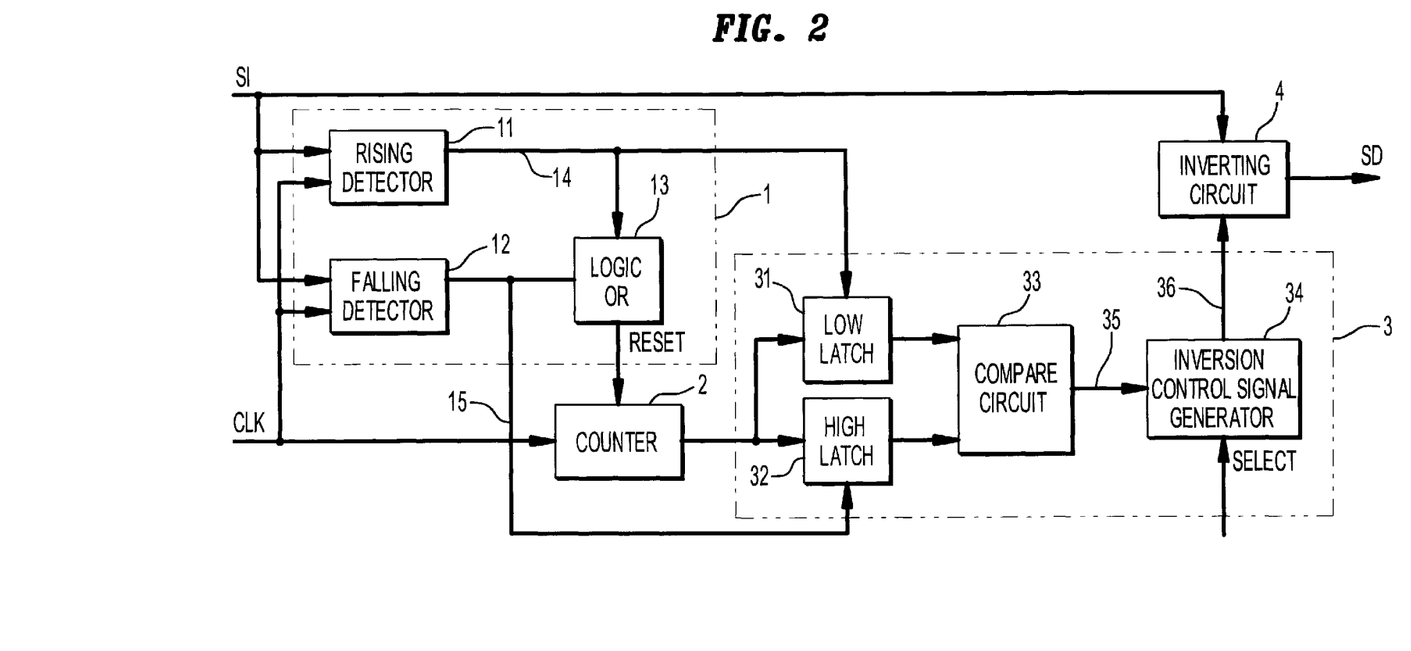
FIG. 2 illustrates first preferred embodiment of the invention in block form.

As shown in FIG. 2, the apparatus of the invention includes a counter 2, an edge detection circuit 1, a logic circuit 3 and an inverting circuit 4. The counter 2 receives a clock signal (CLK) and generates a count value at an output terminal. The reset signal is used to reset the counter 2 to its initial value and to start the count operation. The frequency of the clock signal is substantially greater than that of the input periodical signal SI. The edge detection circuit 1 detects edge transition of the input periodical signal SI and generates the reset signal. The logic circuit 3 responds to the count value and a select signal, and asserts an inversion control signal 36. The inverting circuit 4 inputs the input periodical signal and, responsive to the inversion control signal 36, selectively performs inversion operation to the input periodical signal and generates the output signal of desired polarity.

In a preferred embodiment, the edge detection circuit 1 includes a rising edge detector 11, a falling edge detector 12 and a logic OR gate 13. The rising edge detector 11 has input receiving the clock signal. Responsive to the rising edge of the input periodical signal, the rising edge detector 11 generates a first assertion signal 14. The falling edge detector 12 has input receiving the clock signal. Responsive to the falling edge of the input periodical signal, the falling edge detector 12 generates a second assertion signal 15. The logic OR gate 13 performs logic OR operation on the first and second assertion signals 14, 15 and generates the reset signal. The logic circuit 3 has a first latch 31, a second latch 32, a compare circuit 33 and an inversion control signal generation circuit 34. The first latch 31, responsive to the first assertion signal 14, latches the count value during low duration of the input periodical signal and outputs it as a first count value. The second latch 32, responsive to the second assertion signal 15, latches the count value during high duration of the input periodical signal and outputs it as a second count value. The compare circuit 33 generates a compare result signal 35 by comparing the first and second count values. The inversion control signal generation circuit 34 inputs the compare result signal 35 and select signal, and selectively asserts the inversion control signal 36.

Figure 3A:
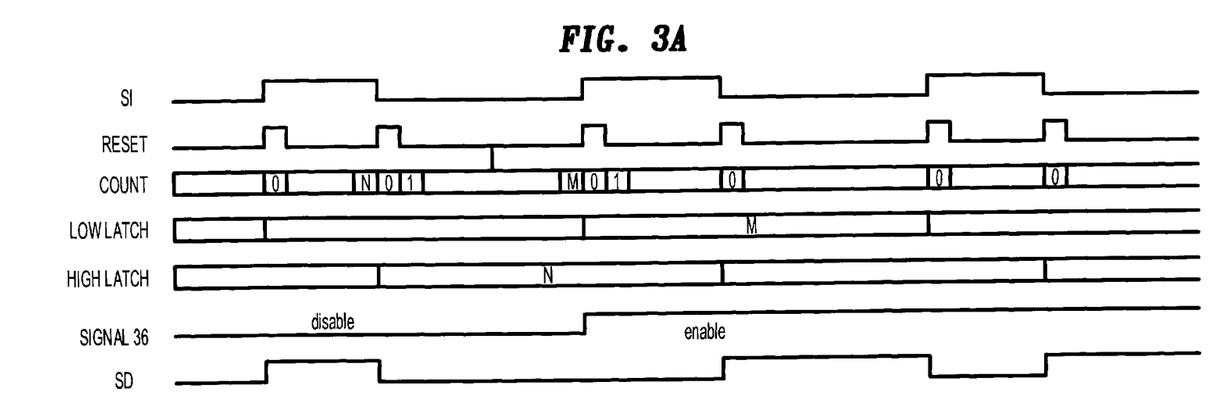
FIG. 3(a) shows a timing diagram of signals in the first embodiment that prescribes a desired periodical signal with shorter active low pulse from an input periodical signal with shorter active high pulse.

FIG. 3(a) shows a timing diagram of signals in the first embodiment that prescribes, via activated state of select signal, a desired periodical signal with shorter active low pulse from an input periodical signal with shorter active high pulse. During high duration of SI, N+1 counts is obtained while during low duration of SI, M+1 counts is obtained. M is larger than N. As counter 2 counts along SI, values of M and N are latched in the first latch 31 and second latch 32 respectively. Since M is larger than N, the result signal 35 and activated select signal enables the generation circuit 34 to assert the inversion control signal 36. After the activation of the inversion control signal 36, the output signal SD appears to be the inversion of the input periodical signal and an output signal with shorter active low pulse is obtained.

Figure 3B:
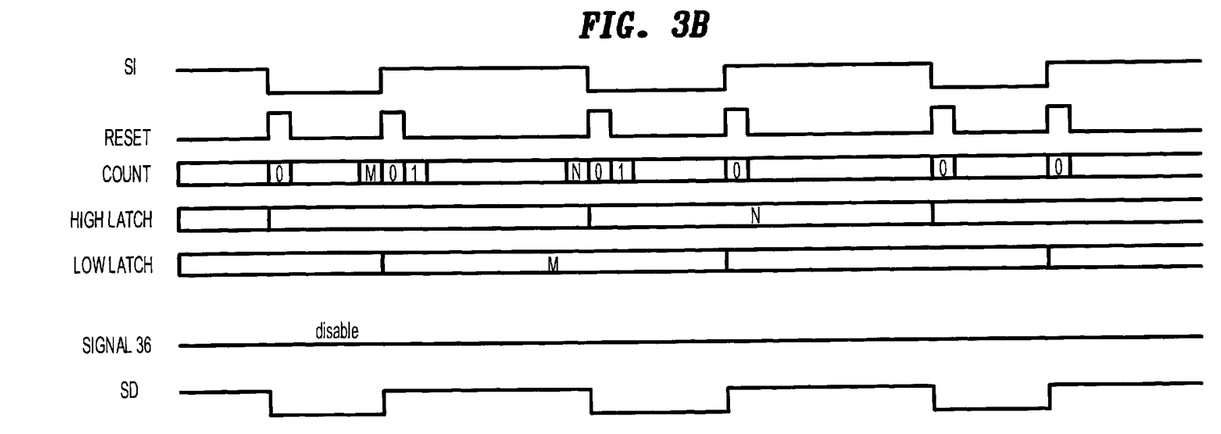
FIG. 3(b) shows a timing diagram of signals in the first embodiment that prescribes a desired periodical signal with shorter active low pulse from an input periodical signal with shorter active low pulse.
Figure 4A:
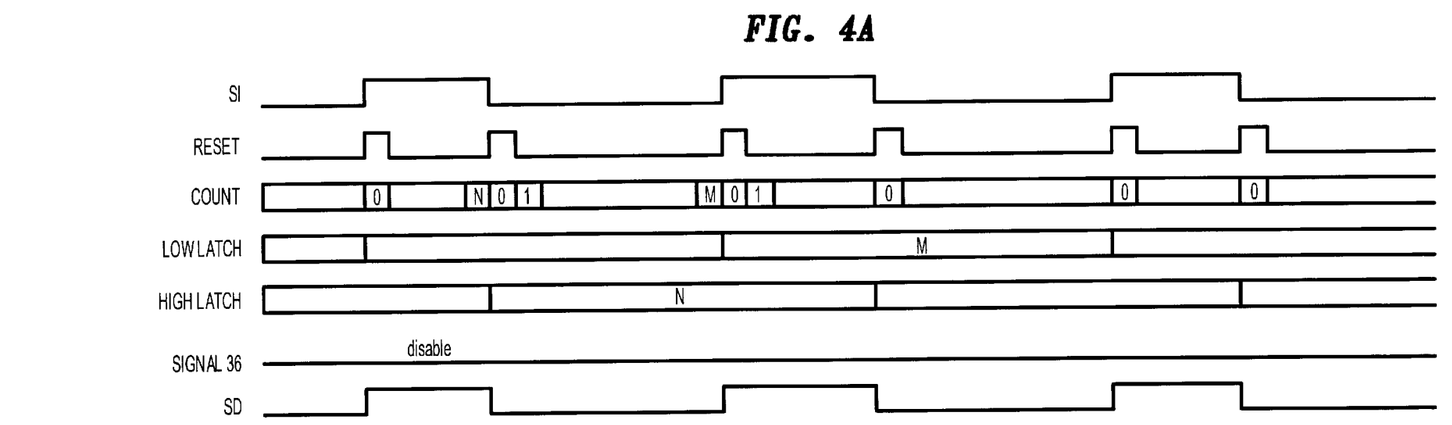
FIG. 4(a) shows a timing diagram of signals in the first embodiment that prescribes a desired periodical signal with shorter active high pulse from an input periodical signal with shorter active high pulse.

FIG. 3(b) shows a timing diagram of signals in the first embodiment that prescribes, via activated state of select signal, a desired periodical signal with shorter active low pulse from an input periodical signal with shorter active low pulse. During low duration of SI, M+1 counts is obtained while during high duration of SI, N+1 counts is obtained. M is smaller than N. As counter 2 counts along SI, values of M and N are latched in the first latch 31 and second latch 32 respectively. Since M is smaller than N, the result signal 35 and activated select signal disables the generation circuit 34 to de-assert the inversion control signal 36. Therefore, the output signal SD appears to be the reproduction of the input periodical signal. FIG. 4(a) shows a timing diagram of signals in the first embodiment that prescribes, via de-activated state of select signal, a desired periodical signal with shorter active high pulse from an input periodical signal with shorter active high pulse. During low duration of SI, M+1 counts is obtained while during high duration of SI, N+1 counts is obtained. M is larger than N. As counter 2 counts along SI, values of M and N are latched in the first latch 31 and second latch 32 respectively. Since M is larger than N, the result signal 35 and de-activated select signal disables the generation circuit 34 to de-assert the inversion control signal 36. Therefore, the output signal SD appears to be the reproduction of the input periodical signal.

Figure 4B:
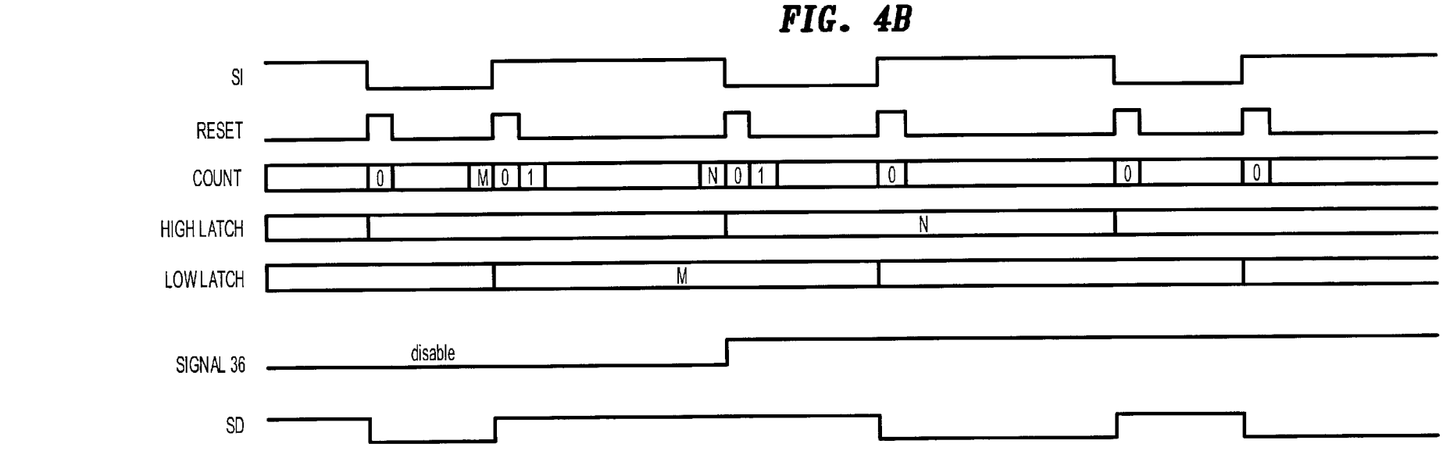
FIG. 4(b) shows a timing diagram of signals in the first embodiment that prescribes a desired periodical signal with shorter active high pulse from an input periodical signal with shorter active low pulse.

FIG. 4(b) shows a timing diagram of signals in the first embodiment that prescribes, via de-activated state of select signal, a desired periodical signal with shorter active high pulse from an input periodical signal with shorter active low pulse. During high duration of SI, N+1 counts is obtained while during low duration of SI, M+1 counts is obtained. M is smaller than N. As counter 2 counts along SI, values of M and N are latched in the first latch 31 and second latch 32 respectively. Since M is smaller than N, the result signal 35 and deactivated select signal enables the generation circuit 34 to assert the inversion control signal 36. After the activation of the inversion control signal 36, the output signal SD appears to be the inversion of input periodical signal and an output signal with shorter active high pulse is obtained.

A second embodiment of the instant invention will be described below with reference to FIG. 5.

Figure 5:
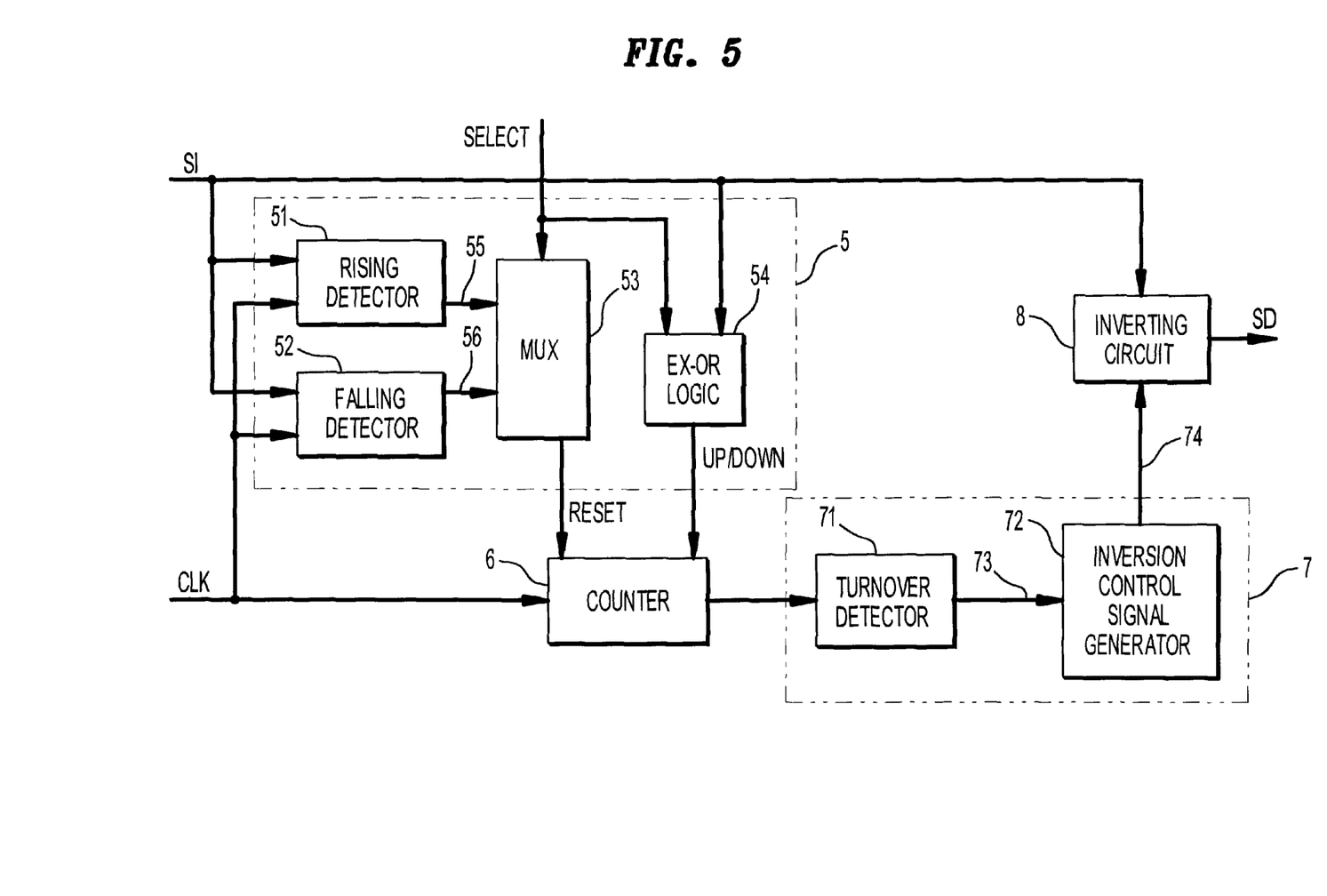
FIG. 5 illustrates second preferred embodiment of the invention in block form.

As shown in FIG. 5, the apparatus of the invention includes an up/down counter 6, an edge detection circuit 5, a logic circuit 7 and an inverting circuit 8. The up/down counter 6 receives a clock signal (CLK) and, responsive to an up/down control signal, generates a count value at an output terminal. The reset signal is used to reset the counter 6 to its initial value and to start the count operation. The frequency of the clock signal is substantially greater than that of the input periodical signal SI. The edge detection circuit 5 detects edge transition of the input periodical signal SI and generates the reset signal and the up/down control signal. The logic circuit 7 responds to the count value and asserts an inversion control signal 74. The inverting circuit 8 inputs the input periodical signal and, responsive to the inversion control signal 74, selectively performs inversion operation to the input periodical signal and generates the output signal SD of desired polarity.

In a preferred embodiment, the edge detection circuit 5 includes a rising edge detector 51, a falling edge detector 52, a multiplexer 53 and a logic exclusive-OR gate 54. The rising edge detector 51 has input receiving the clock signal. Responsive to the rising edge of the input periodical signal, the rising edge detector 51 generates a first assertion signal 55. The falling edge detector 52 has input receiving the clock signal. Responsive to the falling edge of the input periodical signal, the falling edge detector 52 generates a second assertion signal 56. The multiplexer 53 has inputs receiving the first and second assertions signals respectively. Under the direction of the select signal, the multiplexer 53 selects either the first assertion signal 55 or the second assertion signal 56 as the reset signal. The logic exclusive-OR gate 54 performs logic exclusive-OR operation on the input periodical signal and the selection signal and generates the up/down control signal. As the select signal is enabled, the state of up/down control signal directs the counter 6 to count in one direction, e.g. upwardly, during period in which SI signal is logic high. As the select signal is enabled, the state of up/down control signal directs the counter 6 to count in opposite direction, e.g. downwardly, during period in which SI signal is logic low. As the select signal is disabled, the state of up/down control signal directs the counter 6 to count in one direction, e.g. downwardly, during period in which SI signal is logic high. As the select signal is disabled, the state of up/down control signal directs the counter 6 to count in opposite direction, e.g. upwardly, during period in which SI signal is logic low. The logic circuit 7 has a turnover detector 71 and an inversion control generation circuit 72. The turnover detector 71 detects a transition of the count value from zero to negative and generates a transition signal 73 in response. The generation circuit 72 inputs the transition signal 73 and asserts the inversion control signal 74.

Figure 6A:
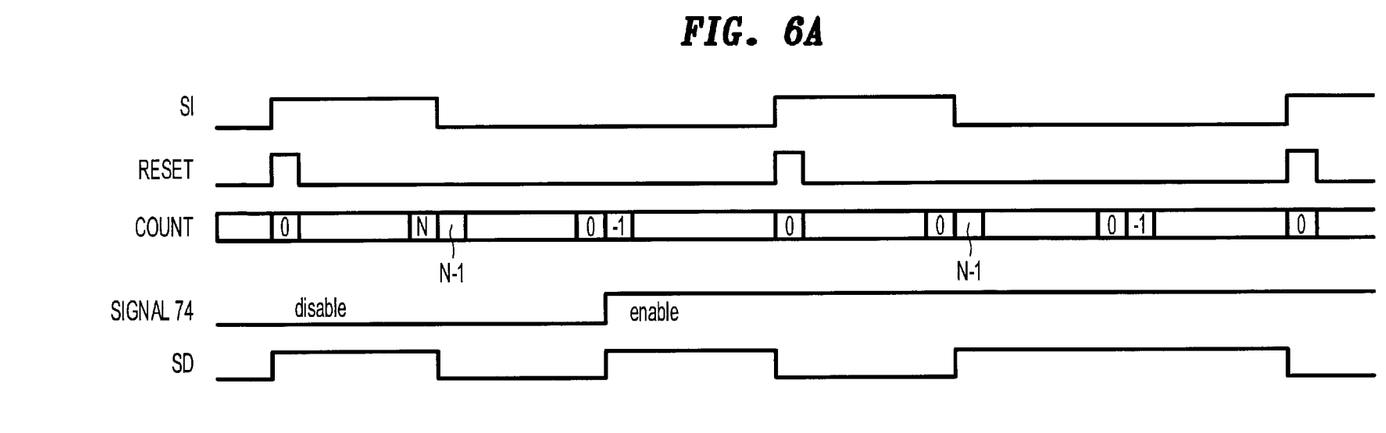
FIG. 6(a) shows a timing diagram of signals in the second embodiment that prescribes a desired periodical signal with shorter active low pulse from an input periodical signal with shorter active high pulse.

FIG. 6(a) shows a timing diagram of signals in the second embodiment that prescribes, via activated state of select signal, a desired periodical signal with shorter active low pulse from an input periodical signal with shorter active high pulse. The activated select signal selects the signal 55 as the reset signal. During high duration of SI, N+1 counts is obtained while during low duration of SI, M+1 counts is obtained. M is larger than N. As counter 6 counts along SI, at edge transition of high to low of SI, the counter 6 counts downwardly. Since M is larger than N, at one point, transition of count value from zero to negative occurs. At this point, the transition signal 73 enables the generation circuit 72 to assert the inversion control signal 74. After the activation of the inversion control signal 74, the output signal SD appears to be the inversion of the input periodical signal and an output signal with shorter active low pulse is obtained.

Figure 6B:
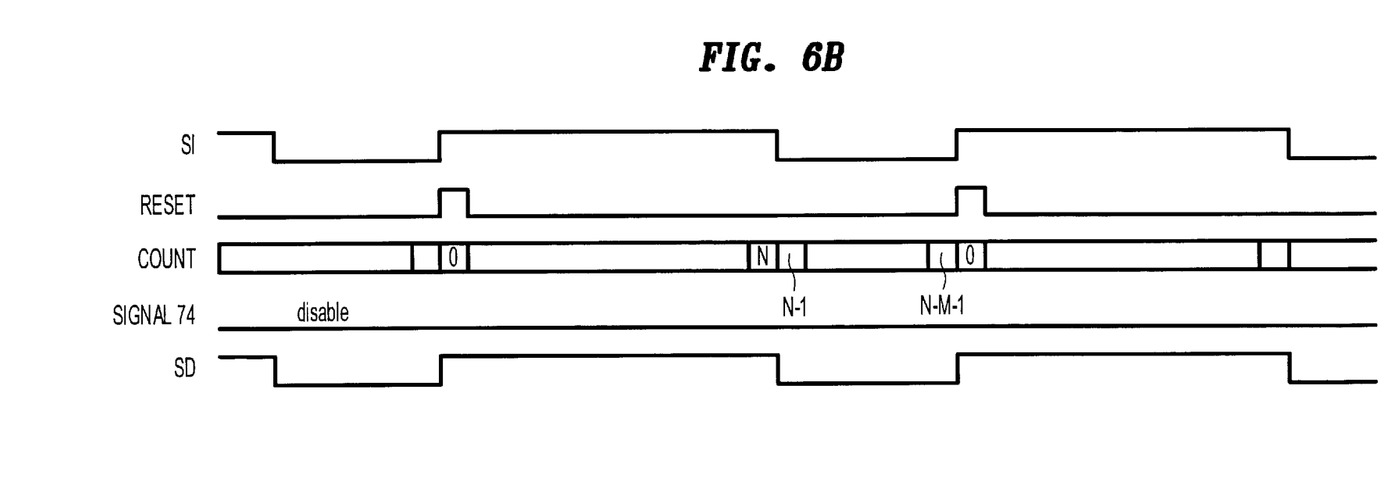
FIG. 6(b) shows a timing diagram of signals in the second embodiment that prescribes a desired periodical signal with shorter active low pulse from an input periodical signal with shorter active low pulse.

FIG. 6(b) shows a timing diagram of signals in the second embodiment that prescribes, via activated state of select signal, a desired periodical signal with shorter active low pulse from an input periodical signal with shorter active low pulse. The activated select signal selects the signal 55 as the reset signal. During low duration of SI, M+1 counts is obtained while during high duration of SI, N+1 counts is obtained. M is smaller than N. As counter 6 counts along SI, at edge transition of high to low of SI, the counter 6 counts downwardly. Since M is smaller than N, transition of count value from zero to negative never occurs. The transition signal 73 is always de-asserted to disable the generation circuit 72 to de-assert the inversion control signal 74. Therefore, the output signal SD appears to be the reproduction of the input periodical signal.

Figure 7A:
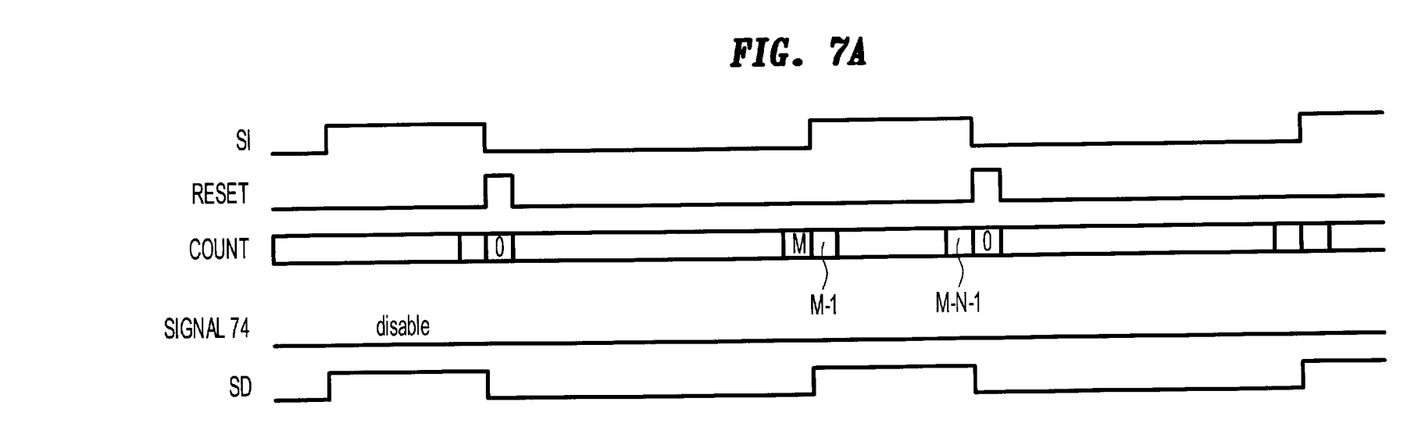
FIG. 7(a) shows a timing diagram of signals in the second embodiment that prescribes a desired periodical signal with shorter active high pulse from an input periodical signal with shorter active high pulse.

FIG. 7(a) shows a timing diagram of signals in the second embodiment that prescribes, via de-activated select signal, a desired periodical signal with shorter active high pulse from an input periodical signal with shorter active high pulse. The de-activated select signal selects the signal 56 as the reset signal. During low duration of SI, M+1 counts is obtained while during high duration of SI, N+1 counts is obtained. M is larger than N. As counter 6 counts along SI, at edge transition of low to high of SI, the counter 6 counts downwardly. Since M is larger than N, transition of count value from zero to negative never occurs. The transition signal 73 is always de-asserted to disable the generation circuit 72 to de-assert the inversion control signal 74. Therefore, the output signal SD appears to be the reproduction of the input periodical signal.

Figure 7B:
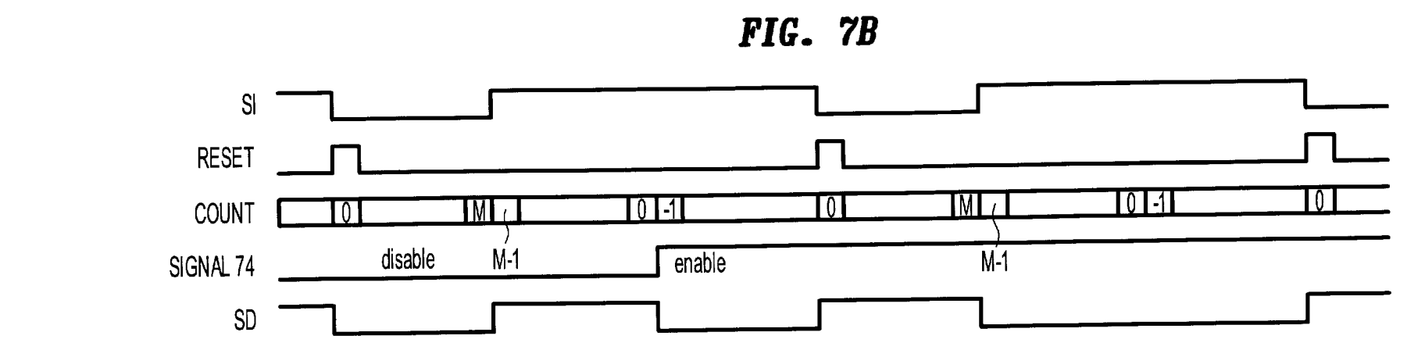
FIG. 7(b) shows a timing diagram of signals in the second embodiment that prescribes a desired periodical signal with shorter active high pulse from an input periodical signal with shorter active low pulse.

FIG. 7(b) shows a timing diagram of signals in the second embodiment that prescribes, via de-activated state of select signal, a desired periodical signal with shorter active high pulse from an input periodical signal with shorter active low pulse. The de-activated select signal selects the signal 56 as the reset signal. During high duration of SI, N+1 counts is obtained while during low duration of SI, M+1 counts is obtained. M is smaller than N. As counter 6 counts along SI, at edge transition of low to high of SI, the counter 6 counts downwardly. Since M is smaller than N, at one point, transition of count value from zero to negative occurs. At this point, the transition signal 73 enables the generation circuit 72 to assert the inversion control signal 74. After the activation of the inversion control signal 74, the output signal SD appears to be the inversion of the input periodical signal and an output signal with shorter active high pulse is obtained.

The above two embodiments may be best summarized by the following methodology.

The method of the invention generates an output signal of desired polarity from an input periodical signal of frequency f1 via a clock signal of frequency f2. f2 is substantially greater than f1. The desired A polarity is indicated by a select signal. The input periodical signal includes a cyclic duration T1 of a first logic state and duration T2 of a second logic state. The method includes the steps of (1) counting pulses N of the clock signal during T1; (2) counting pulses M of the clock signal during T2; and (3) generating the output signal by inverting the input periodical signal as M being larger than N and an activated state of select signal are determined.

As M being larger than N and an de-activated state of select signal are determined, the method generates the output signal by replicating the input periodical signal.

As M being smaller than N and an activated state of select signal are determined, the method generates the output signal by replicating the input periodical signal.

As M being smaller than N and an de-activated state of select signal are determined, the method generates the output signal by inverting the input periodical signal.

In a preferred embodiment, the first logic state is logic high and second logic state is logic low.

I claim:

1. An apparatus for generating an output signal of desired polarity from an input periodical signal of frequency f1, comprising:

a counter for counting pulse of a clock signal of frequency f2 and generating a count value at an output terminal thereof, wherein f2 is substantially greater than f1;

a first means for detecting edge transition of the input periodical signal and generating a reset signal to reset the counter;

a second means, responsive to the count values during low duration and high duration of the input signal, and a select signal, for asserting an inversion control signal; and a third means inputting the input periodical signal and, responsive to the inversion control signal, for selectively performing inversion operation to the input periodical signal to generate the output signal of desired polarity.

2. The apparatus as recited in claim 1, wherein the first means comprises:

a first detector having input receiving the clock signal and, responsive to rising edge of the input periodical signal, for generating a first assertion signal;

a second detector having input receiving the clock signal and, responsive to falling edge of the input periodical signal, for generating a second assertion signal; and a logic OR means for performing logic OR operation on the first and second assertion signals and generating the reset signal.

3. The apparatus as recited in claim 2, wherein the second means comprises:

a first latch, responsive to the first assertion signal, for latching and outputting the count value during low duration of the input periodical signal as a first count value;

a second latch, responsive to the second assertion signal, for latching and outputting the count value during high duration of the input periodical signal as a second count value;

a means generating a result signal by comparing the first count value with the second count value; and a means, responsive to the result signal and the select signal, for selectively asserting the inversion control signal.

4. An apparatus for generating an output signal of desired polarity from an input periodical signal of frequency f1, comprising:

an up/down counter, responsive to an up/down control signal, for selectively upwardly or downwardly counting pulse of a clock signal of frequency f2 and generating a count value at an output terminal thereof, wherein f2 is substantially greater than f1;

a first means, responsive to a select signal, for detecting edge transition of the input periodical signal and generating a reset signal to reset the counter, and the up/down control signal;

a second means, responsive to the count value, for asserting an inversion control signal; and a third means inputting the input periodical signal and, responsive to the inversion control signal, for selectively performing inversion operation to the input periodical signal to generate the output signal of desired polarity.

5. The apparatus as recited in claim 4, wherein the first means comprises:

a first detector having input receiving the clock signal and, responsive to rising edge of the input periodical signal, for generating a first assertion signal;

a second detector having input receiving the clock signal and, responsive to falling edge of the input periodical signal, for asserting a second assertion signal;

a multiplexer, having inputs receiving the first and second assertion signals respectively, for outputting the reset signal under control of the select signal; and a logic exclusive-OR means performing logic exclusive-OR operation on the select signal and the input periodical signal for generating the up/down control signal.

6. The apparatus as recited in claim 5, wherein the second means comprises:

a turnover detector detecting a transition of the count value from zero to negative for generating a transition signal; and a means, responsive to the transition signal, for selectively asserting the inversion control signal.

7. A method for generating an output signal of desired polarity from an input periodical signal of frequency f1 via a clock signal of frequency f2, f2 being substantially greater than f1, the input periodical signal including a cyclic duration T1 of a first logic state and duration T2 of a second logic state, the desired polarity being indicated by a select signal, comprising the steps of:

counting pulses N of the clock signal during T1;

counting pulses M of the clock signal during T2; and generating the output signal by inverting the input periodical signal as M being larger than N and an activated state of select signal are determined.

8. The method of claim 7, further comprising the steps of:

generating the output signal by replicating the input periodical signal as M being larger than N and an deactivated state of select signal are determined.

9. The method of claim 7, further comprising the steps of:

generating the output signal by replicating the input periodical signal as M being smaller than N and an activated state of select signal are determined.

10. The method of claim 7, further comprising the steps of:

generating the output signal by inverting the input periodical signal as M being smaller than N and an deactivated state of select signal are determined.

11. The method of claim 7, wherein the first logic state is logic high and second logic state is logic low.

* * * * *